(12) United States Patent
Schreiber et al.

(10) Patent No.: US 7,940,580 B2
(45) Date of Patent: May 10, 2011

(54) VOLTAGE SHIFTING WORD-LINE DRIVER AND METHOD THEREFOR

(75) Inventors: Russell Schreiber, Austin, TX (US); Keith Kasprak, Austin, TX (US); Martin P. Piorkowski, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 131 days.

(21) Appl. No.: 12/339,952

(22) Filed: Dec. 19, 2008

(65) Prior Publication Data

US 2010/0157695 A1 Jun. 24, 2010

(51) Int. Cl.
*G11C 7/00* (2006.01)
(52) U.S. Cl. ............ 365/189.11; 365/230.06; 365/233.1
(58) Field of Classification Search ............. 365/189.11, 365/230.06, 233.1
See application file for complete search history.

(56) References Cited

U.S. PATENT DOCUMENTS

| | | | | |
|---|---|---|---|---|
| 5,371,705 A * | 12/1994 | Nakayama et al. | ...... | 365/185.23 |
| 5,646,900 A * | 7/1997 | Tsukude et al. | ...... | 365/205 |
| 5,712,823 A * | 1/1998 | Gillingham | ...... | 365/149 |
| 5,831,905 A * | 11/1998 | Hirano | ...... | 365/185.29 |
| 5,862,098 A * | 1/1999 | Jeong | ...... | 365/230.06 |
| 6,044,020 A * | 3/2000 | Chung et al. | ...... | 365/185.23 |
| 6,101,126 A * | 8/2000 | Chung et al. | ...... | 365/185.23 |
| 6,181,606 B1 * | 1/2001 | Choi et al. | ...... | 365/185.23 |
| 6,201,745 B1 * | 3/2001 | Ryu et al. | ...... | 365/200 |
| 6,233,198 B1 * | 5/2001 | Choi | ...... | 365/230.06 |
| 6,418,075 B2 * | 7/2002 | Shimano et al. | ...... | 365/227 |
| 6,426,914 B1 * | 7/2002 | Dennard et al. | ...... | 365/230.06 |
| 6,490,189 B1 * | 12/2002 | Kang et al. | ...... | 365/145 |
| 6,597,621 B2 * | 7/2003 | Tsuji et al. | ...... | 365/230.03 |
| 6,603,702 B2 * | 8/2003 | Kojima | ...... | 365/230.06 |
| 6,665,229 B2 * | 12/2003 | Lee et al. | ...... | 365/230.06 |
| 6,911,703 B2 * | 6/2005 | Hidaka | ...... | 257/369 |
| 7,072,218 B2 * | 7/2006 | Fujito et al. | ...... | 365/185.18 |
| 7,106,649 B2 * | 9/2006 | Wada et al. | ...... | 365/230.06 |
| 7,254,081 B2 * | 8/2007 | Sugawara et al. | ...... | 365/226 |
| 7,283,406 B2 * | 10/2007 | Lu et al. | ...... | 365/189.09 |
| 7,345,946 B1 * | 3/2008 | Chapman et al. | ...... | 365/230.06 |
| 7,440,354 B2 * | 10/2008 | Liston et al. | ...... | 365/227 |
| 7,706,207 B2 * | 4/2010 | Liston et al. | ...... | 365/230.03 |
| 7,710,796 B2 * | 5/2010 | Cottier et al. | ...... | 365/189.11 |

* cited by examiner

*Primary Examiner* — Viet Q Nguyen

(57) ABSTRACT

A memory device is disclosed that includes a plurality of word-lines, with each word-line connected to at least one bitcell. Each of the plurality of word-lines is connected to a corresponding driver module to drive the word-line in response to a corresponding select signal. Further, each driver module is connected to a level shifter to shift the corresponding select signal so that the driver module provides a level-shifted signal at the first word-line in response to assertion of the first select signal. A single level shifter can be connected to multiple driver modules, thereby reducing the area required to implement level-shifting for multiple word-lines.

18 Claims, 3 Drawing Sheets

VOLTAGE SHIFTING WORD-LINE DRIVER AND METHOD THEREFOR

BACKGROUND

1. Field of the Disclosure

The present disclosure relates to integrated circuit devices and more particularly to integrated circuit memory devices.

2. Description of the Related Art

Different modules of an integrated circuit device may operate at different voltages. For example, some modules can be operated at a relatively low voltage in order to reduce power dissipation and increase operating speed of the device. The relatively low voltage may be insufficient for other modules, such as memory. Such modules are therefore operated at a higher voltage. A voltage level shifting circuit is typically used to provide an interface between modules operating at different voltage levels. However, level-shifting circuits can require considerable device area and consume significant power.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A memory device is disclosed that includes a plurality of word-lines, with each word-line connected to at least one bitcell. Each of the plurality of word-lines is connected to a corresponding driver module to drive the word-line in response to a corresponding select signal. Further, each driver module is connected to a level shifter to shift the corresponding select signal so that the driver module provides a level-shifted signal at the first word-line in response to assertion of the first select signal. A single level shifter can be connected to multiple driver modules, thereby reducing the area required to implement level-shifting for multiple word-lines.

Figure 1:
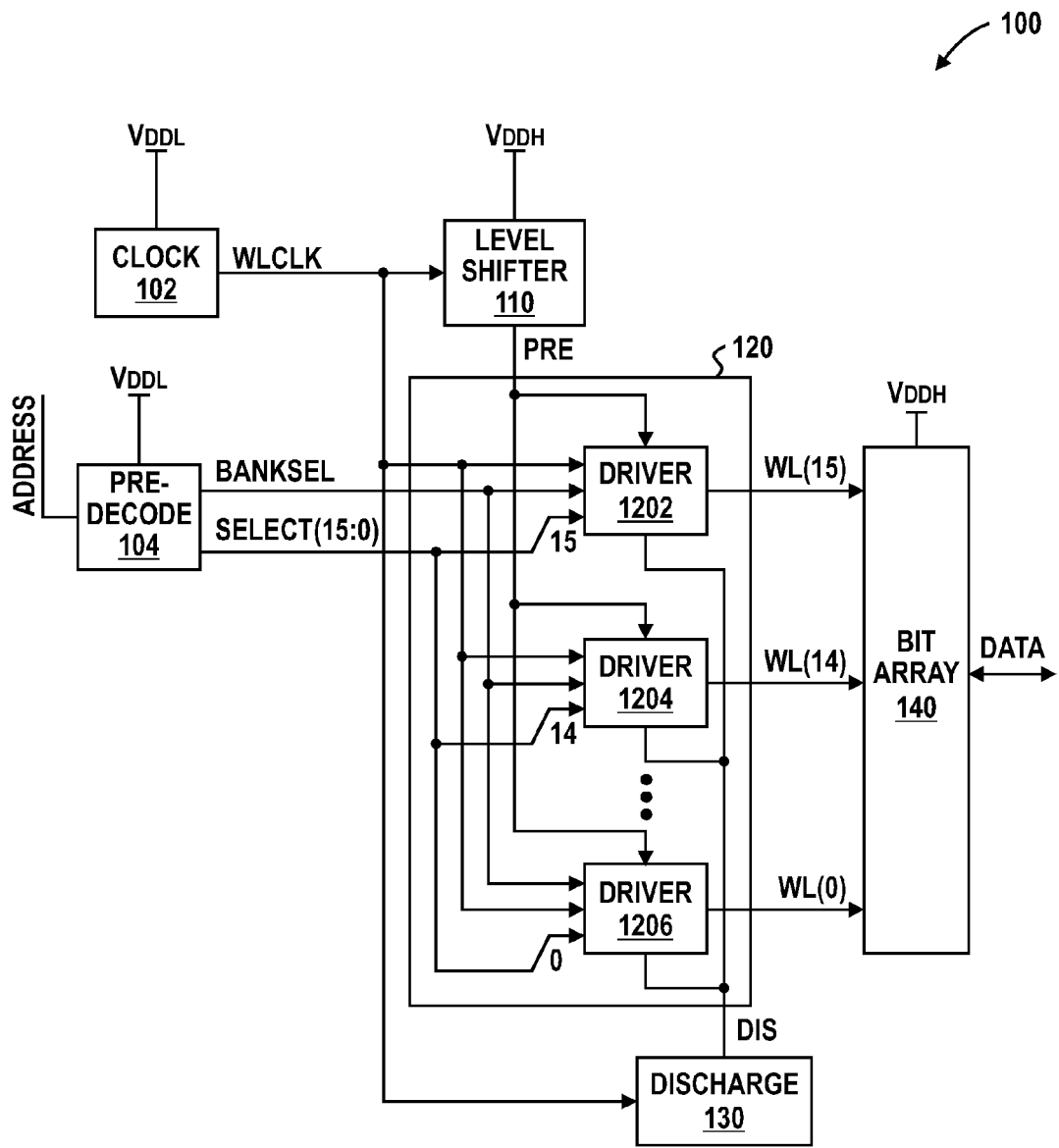
FIG. 1 is a block diagram illustrating a memory device in accordance with a specific embodiment of the present disclosure.

FIG. 1 is a block diagram illustrating a memory device 100 in accordance with a specific embodiment of the present disclosure. Memory device 100 includes a clock module 102, a predecode module 104, a level shifter 110, a driver bank 120, a discharge module 130, and a bit array 140. Driver bank 120 further includes drivers 1202, 1204, and 1206.

Clock module 102 has an input to receive a voltage reference labeled "VDDL," and an output to provide a signal labeled "WLCLK." Predecode module 104 has a first input to receive voltage reference VDDL, a second input to receive an input labeled "ADDRESS," a first output to provide a signal labeled "SELECT(15:0)," and a second input to provide a signal labeled "BANKSEL." Level shifter 110 has a first input to receive a voltage reference labeled "VDDH," a second input to receive signal WLCLK, and an output connected to a node labeled "PRE." Driver 1202 has a first input connected to node PRE, a second input to receive signal WLCLK, a third input to receive signal SELECT(15), a fourth input to receive signal BANKSEL, a fifth input connected to a node labeled "DIS," and an output to provide a signal labeled WL(15). Driver 1204 has a first input connected to node PRE, a second input to receive signal WLCLK, a third input to receive signal SELECT(14), a fourth input to receive signal BANKSEL, a fifth input connected to node DIS, and an output to provide a signal labeled WL(14).

Driver 1202 has a first input connected to node PRE, a second input to receive signal WLCLK, a third input to receive signal SELECT(0), a fourth input to receive signal BANKSEL, a fifth input connected to node DIS, and an output to provide a signal labeled WL(0). Discharge module 130 has a first input to receive signal WLCLK, and an output connected to node DIS. Bit array 140 has a first input to receive voltage reference VDDH, a second input to receive signal WL(15), a third input to receive signal WL(14), a fourth input to receive signal WL(0), and an input/output to receive or provide a signal labeled "DATA."

Memory device 100 is used to store information, and the information can be subsequently accessed. Signal ADDRESS is decoded to select a particular location within memory device 100 for access. When the value of signal ADDRESS is valid, signal WLCLK is asserted and a word-line such as WL(0) is asserted that corresponds to the decoded address. Data is read from or written to bit array 140 using storage locations (not shown) that are associated with the asserted word-line. Memory device 100 operates using two different supply voltages, VDDH and VDDL, where the potential of voltage reference VDDH is greater than the potential of voltage reference VDDL. For example, voltage reference VDDH may be 1.4 volts and voltage reference VDDL may be 1.0 volts. Driver bank 120 combined with level shifter 110 and discharge module 130 forms a dynamic-logic circuit using a precharge-discharge technique.

Clock module 102 is configured to assert signal WLCLK when information needs to be written to or read from memory device 100. Clock module 102 receives power from voltage reference VDDL and signal WLCLK is at a potential corresponding to voltage reference VDDL when asserted and at a ground potential (typically zero volts) when inactive. Signal WLCLK is a clock signal used to precharge and discharge each word-line driver of driver bank 120.

Predecode module 104 is configured to decode signal ADDRESS into individual and mutually exclusive select signals. If the value of signal ADDRESS corresponds to memory device 100, predecode module 104 will assert bank select signal BANKSEL, and a single bit of signal SELECT(15:0) that corresponds to the particular memory location specified by signal ADDRESS. For example, signal ADDRESS may represent a five-bit binary encoded signal suitable for addressing two memory devices that each contains sixteen storage locations. If the address encoded by signal ADDRESS corresponds to memory device 100, signal BANKSEL will be asserted in addition to one bit of select signal SELECT(15:0). Predecode module 104 receives power from voltage reference VDDL and signals SELECT (15:0) and BANKSEL transition between ground and a potential corresponding to VDDL.

Level shifter 110 is a single P-channel metal oxide semiconductor (PMOS) transistor. All sixteen drivers at driver bank 120 share level shifter 110. When signal WLCLK is at a logic-low level (ground potential), signal PRE, as well as an intermediate node within each of drivers 1202, 1204, and 1206 (not shown), is precharged to a potential corresponding to VDDH.

Discharge module 130 is a single N-channel metal oxide semiconductor (NMOS) transistor that is shared by all sixteen drivers of driver bank 120. In another embodiment, discharge module 130 can be replicated and included at each driver. When clock signal WLCLK is at a logic-high level, and signal BANKSEL is asserted, the intermediate node at one of the sixteen drivers will be discharged as determined by the assertion of a respective select signal.

Driver bank 120 includes sixteen drivers to provide sixteen individual word-lines WL(15:0). Only one of the sixteen word-lines can be asserted at any particular time, determined by a respective one of the sixteen select signals. Note that a driver bank can include a different number of word-line drivers. For example, eight word-line drivers can share a single level shifter.

Bit array 140 contains sixteen storage locations. Each storage location can store a data value, and each data value can include individual data bits. Each storage location is selected by a corresponding one of word-lines WL(15:0). Data can be stored at the selected storage location during a write access, or retrieved during a read access. Bit array 140 will not function correctly when operated at the low voltage level corresponding to voltage reference VDDL, so the elevated potential of voltage reference VDDH is used to provide power to bit array 140. In the particular embodiment illustrated, bit array 140 is a static random access memory (SRAM) bit array, but may include dynamic random access memory (DRAM), non-volatile random access memory (NVRAM), or another type of memory.

Figure 2:
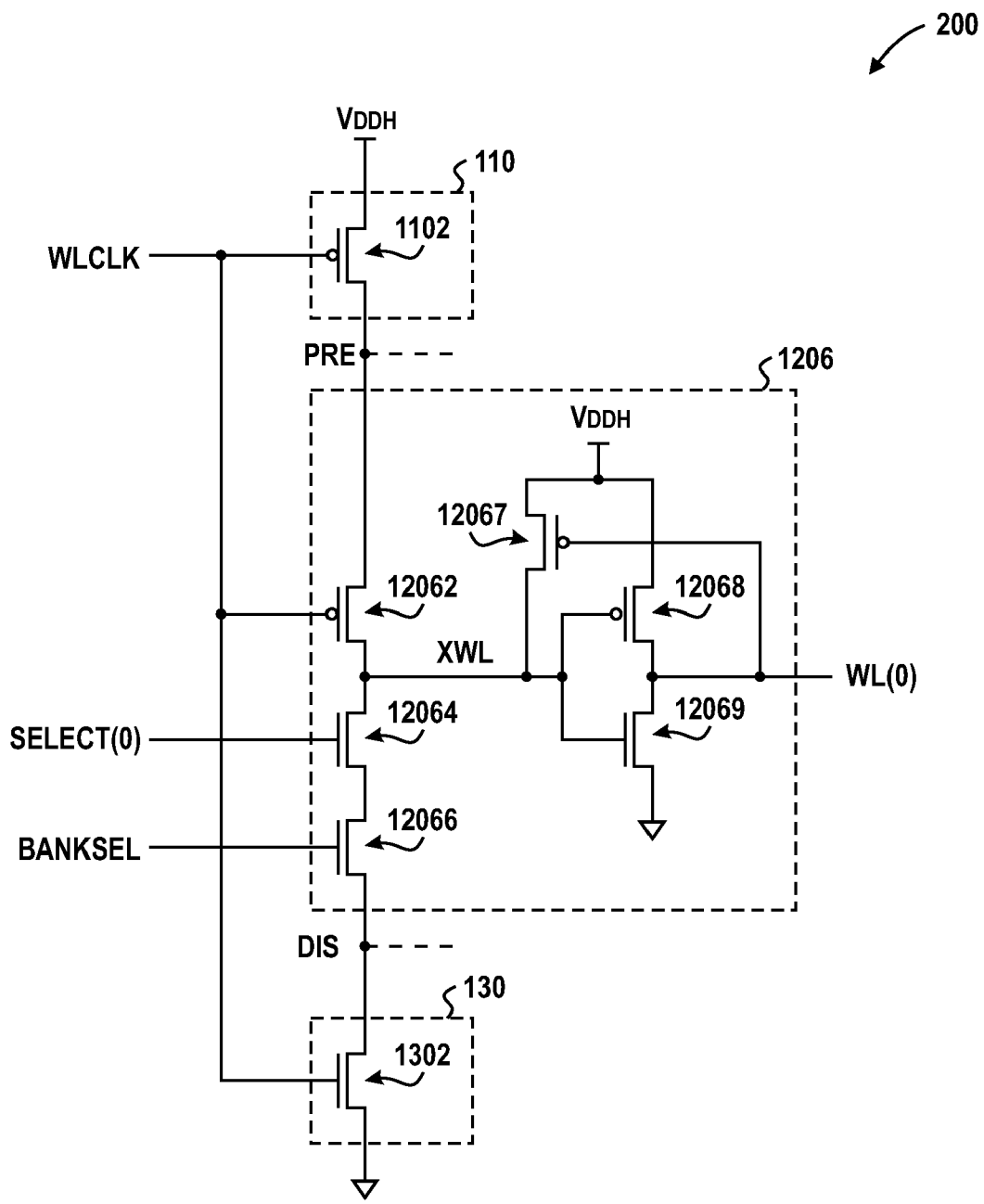
FIG. 2 is a schematic diagram illustrating a portion of the memory device of FIG. 1 in accordance with a specific embodiment of the present disclosure.

The operation of memory device 100 can be better understood with reference to FIG. 2. FIG. 2 is a schematic diagram illustrating a portion 200 the memory device of FIG. 1 in accordance with a specific embodiment of the present disclosure. Portion 200 includes level shifter 110, driver 1206, and discharge module 130, each illustrated at FIG. 1. Level shifter 110 includes a PMOS transistor 1102. Driver 1206 includes a PMOS transistors 12062, 12067, and 12068, and NMOS transistors 12064, 12066, and 12069. Discharge module 130 includes a NMOS transistor 1302.

PMOS transistor 1102 has a source connected to voltage reference VDDH, a gate to receive signal WLCLK, and a drain connected to node PRE. PMOS transistor 12062 has a source connected to node PRE, a gate to receive signal WLCLK, and a drain connected to a node labeled "XWL." NMOS transistor 12064 has a drain connected to node XWL, a gate connected to signal SELECT(0), and a source. NMOS transistor 12066 has a drain connected to the source of NMOS transistor 12064, a gate to receive signal BANKSEL, and a source connected to node DIS. NMOS transistor 1302 has a drain connected to node DIS, a gate to receive signal WLCLK, and a source connected to ground. PMOS transistor 12067 has a source connected to voltage reference VDDH, a gate to receive signal WL(0), and a drain connected to node to XWL. PMOS transistor 12068 has a source connected to voltage reference VDDH, a gate connected to node XWL, and a drain to provide signal WL(0). NMOS transistor 12069 has a drain to the drain of PMOS transistor 12068, a gate connected to node XWL, and a source connected to ground.

PMOS transistors 1102, transistors 12062, 12064 and 12066, and NMOS transistor 1302 form a precharge-discharge circuit. As illustrated in FIG. 1, sixteen individual driver circuits are connected in parallel and each provides a corresponding bit of word-line signal WL(15:0). The sixteen driver circuits share a single level shifter, PMOS transistor 1102, and a single discharge module, NMOS transistor 1302.

Memory device 100 operates based on a series of alternating precharge phases and discharge phases. During each precharge phase, signal WLCLK is at a logic-low level and PMOS transistors 1102 and 12062 are both conductive, which charges nodes PRE and XWL to approximately a potential corresponding to voltage reference VDDH. During each discharge phase, signal WLCLK transitions to a logic-high level and NMOS transistor 1302 is conductive. Node XWL conditionally discharges to an approximately ground potential determined by the logic-levels of signals SELECT(0) and BANKSEL. Only one driver from among the sixteen drivers of FIG. 1 receives an active-high SELECT signal. Therefore, node XWL is discharged at only the selected driver circuit. PMOS transistor 12068 and NMOS transistor 12069 form an inverter, and only the single word-line corresponding to the discharged driver is asserted. For example, during the precharge phase, each driver at FIG. 1 is precharged, and word-lines WL(15:0) are each at a logic-low level. During the discharge phase, only one of word-lines WL(15:0) can transition to a logic-high level, and only if signal BANKSEL is also asserted.

During the discharge phase, signal WLCLK is at a logic-high level. Signals WLCLK is provided by circuitry that receives power from voltage reference VDDL, and therefore signal WLCLK transitions between a logic-low level ground potential and a logic-high level corresponding to voltage reference VDDL. The source of level shifter 110, PMOS transistor 1102, is at a potential corresponding to voltage reference VDDH. Assuming the potential of voltage reference VDDH is greater than that of voltage reference VDDL, the gate-to-source voltage (Vgs) of PMOS transistors 1102 and 12062 is non-zero, and PMOS transistors 1102 and 12062 are therefore partially conductive. If signals SELECT(0) and BANKSEL are at a logic-high level, node XWL discharges when signal WLCLK is asserted. The voltage difference between voltage references VDDH and VDDL, Vdelta, is divided across PMOS transistors 1102 and 12062, so Vgs of PMOS transistors 1102 and 12062 is approximately equal to Vdelta/2. For example, if the difference between the levels of voltage references VDDH and VDDL is approximately 400 mV, then PMOS transistors 1102 and 12062 are both operating in a sub-threshold region. Thus, minimal current flows to ground through PMOS transistors 1102, 12062, and NMOS transistors 12064, 12066, and 1302. Note that this small current flows only in the one selected word-line and only while signal WLCLK is asserted. Furthermore, signal WLCLK remains at a logic-low level at memory banks that are not selected, and their respective drivers will dissipate only minimal leakage current.

As previously described, PMOS transistor 12068 and NMOS transistor 12069 form an inverter, and PMOS transistor 12067 is a weak keeper device to help maintain inactive word-lines in an inactive state by pulling node XWL up to a potential corresponding to signal reference VDDH. Transistors 12068, 12069, and 12067 implement a signal driver module capable of driving the capacitive load presented by bit array 140. The driver circuit illustrated at FIG. 2 includes two select transistors, NMOS transistors 12064 and 12066, associated with the two select signals SELECT(0) and BANKSEL. Additional series connected NMOS devices can be included without departing from the scope of the present disclosure.

Figure 3:
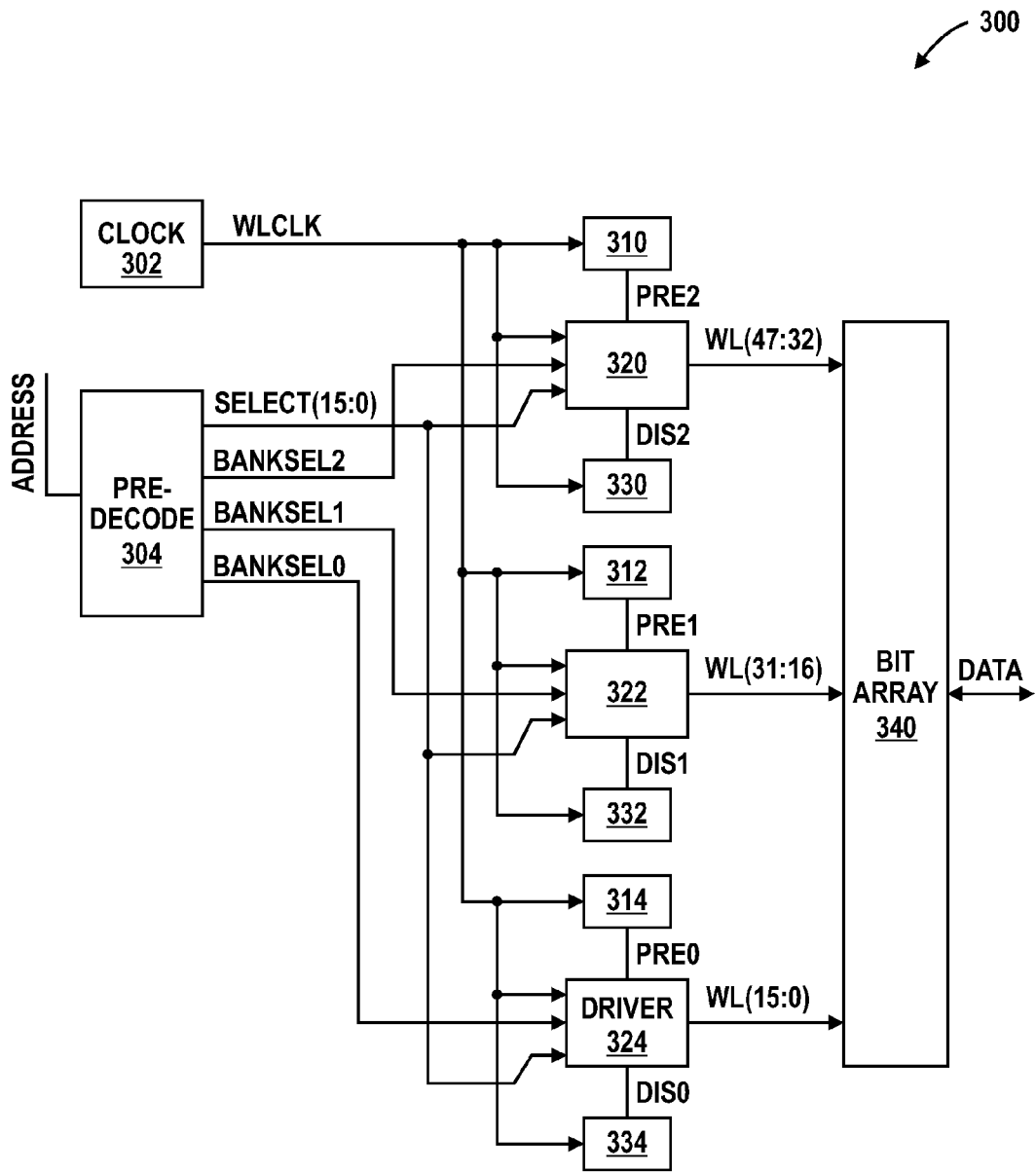
FIG. 3 is a block diagram illustrating a memory device in accordance with a specific embodiment of the present disclosure.

FIG. 3 is a block diagram illustrating a memory device 300 in accordance with a specific embodiment of the present disclosure. Memory device 300 includes a clock module 302, a predecode module 304, level shifters 310, 312, and 314, driver banks 320, 322, and 324, discharge modules 330, 332, and 334, and a bit array 340.

Clock modules 302 has an output to provide signal WLCLK. Predecode module 304 has an input to receive signal ADDRESS, and outputs to provide signals SELECT (15:0), BANKSEL3, BANKSEL2, and BANKSEL0. Level shifter 310 has an input to receive signal WCLCK, and an output connected to node PRE2. Driver bank 320 has a first input to receive signal WCLCK, a second input to receive signal SELECT(15:0), a third input to receive signal BANKSEL2, an input connected to a node labeled "DIS2," and an output to provide signal WL(47:32). Discharge module 330 has a first input to receive signal WLCLK and an output connected to node DIS2. Level shifter 312 has an input to receive signal WCLCK, and an output connected to node PRE1. Driver bank 322 has a first input to receive signal WLCLK, a second input to receive signal SELECT(15:0), a third input to receive signal BANKSEL1, an input connected to a node labeled "DIS1," and an output to provide signal WL(31:16). Discharge module 332 has a first input to receive signal WLCLK and an output connected to node DIS1.

Level shifter 314 has an input to receive signal WCLCK, and an output connected to node PRE0. Driver bank 324 has a first input to receive signal WCLCK, a second input to receive signal SELECT(15:0), a third input to receive signal BANKSEL0, an input connected to a node labeled "DIS0," and an output to provide signal WL(15:0). Discharge module 334 has a first input to receive signal WLCLK and an output connected to node DIS0. Bit array 340 has a first input to receive signal WL(47:32), a second input to receive signal WL(31:16), a third input to receive signal WL(15:0), and an input/output to receive or provide signal DATA.

Memory device 300 is similar to memory device 100 at FIG. 1, but includes three individual banks of word-line drivers corresponding to three banks of memory at bit array 340. Each bank of word-line drivers shares a single level shifter, and is selected by a corresponding bank select signal. Only one of bank select signals BANKSEL2, BANKSEL1, and BANKSEL0 is asserted during a memory access operation. Each of level shifters 311, 312, and 314 corresponds to level shifter 110 at FIG. 1. Each of word-line driver banks 320, 322, and 324 correspond to word-line driver bank 120 at FIG. 1. Each of discharge modules 330, 332, and 334 correspond to discharge module 130 at FIG. 1.

Clock module 302 and predecode module 304 receive power from voltage reference VDDL, and their corresponding output signals transition between ground and a potential corresponding to the level of voltage reference VDDL. Level shifters 310, 312, and 314, and the drivers included at word-line driver banks 320, 322, and 324 receive power from voltage reference VDDH, and signals WL(47:0) transition between ground and a potential corresponding to the level of voltage reference VDDH. Bit array 340 includes three banks and each bank includes sixteen word-lines. When bit array 340 is accessed, only one word-line of WL(47:0) is asserted.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device, comprising:
    a first word-line coupled to a first bit cell;
    a second word-line coupled to a second bit cell;
    a first driver module comprising an input to receive a first select signal and an output coupled to the first word-line;
    a second driver module comprising an input to receive a second select signal and an output coupled to the second word-line; and
    a first level shifter comprising:
        a first input to receive a clock signal;
        a first terminal coupled to the first driver module and the second driver module;
    the first level shifter configured to:
        shift the first select signal so that the first driver module provides a first level-shifted signal at the first word-line in response to assertion of the first select signal, the first level shifter to shift the first select signal in response to assertion of the clock signal; and
        shift the second select signal so that the second driver module provides a second level-shifted signal at the second word-line in response to assertion of the second select signal.

2. The device of claim 1, wherein the first level shifter comprises a first transistor including a first current electrode coupled to a first voltage reference, a second current electrode coupled to the first terminal, and a control electrode configured to receive the clock signal.

3. The device of claim 2, wherein the first driver module comprises:
    a second transistor comprising a first current electrode coupled to the first terminal of the first level shifter, a second current electrode coupled to the first word-line, and a control electrode configured to receive the first clock signal;
    a third transistor comprising a first current electrode coupled to the second current electrode of the second transistor, a second current electrode, and a control electrode configured to receive the first select signal; and
    a fourth transistor comprising a first current electrode coupled to the second current electrode of the third transistor, a second current electrode coupled to a second voltage reference, and a control electrode configured to receive the clock signal.

4. The device of claim 3, wherein the first driver module further comprises:
    a fifth transistor coupled between the third transistor and the fourth transistor, the fifth transistor comprising a first current electrode coupled to the second current electrode of the third transistor, a second current electrode coupled to the first current electrode of the fourth transistor, and a control electrode configured to receive a third select signal.

5. The device of claim 3, wherein the second driver module comprises:
    a fifth transistor comprising a first current electrode coupled to the first terminal of the first level shifter, a second current electrode coupled to the second word-line, and a control electrode configured to receive the first clock signal; and a sixth transistor comprising a first current electrode coupled to the second current electrode of the fifth transistor, a second current electrode coupled to the first current electrode of the fourth transistor, and a control electrode configured to receive a second select signal.

6. The device of claim 3, wherein the first driver module further comprises:
a signal driver module coupled between the second current electrode of the second transistor and the first word-line.

7. The device of claim 6, wherein the signal driver module comprises an inverter.

8. The device of claim 1, further comprising:
a third word-line coupled to a third bit cell;
a fourth word-line coupled to a fourth bit cell;
a third driver module comprising an input to receive a third select signal and an output coupled to the first word-line;
a fourth driver module comprising an input to receive a fourth select signal and an output coupled to the second word-line; and
a second level shifter comprising a first terminal coupled to the third driver module and the fourth driver module, the second level shifter configured to:
shift the third select signal so that the third driver module provides a third level-shifted signal at the third word-line in response to assertion of the third select signal; and
shift the fourth select signal so that the fourth driver module provides a second level-shifted signal at the fourth word-line in response to assertion of the fourth select signal.

9. A device, comprising:
a first plurality of bit cells, each of the first plurality of bit cells coupled to a corresponding one of a first plurality of word-lines;
a first plurality of driver modules, each of the first plurality of driver modules comprising an input to receive a corresponding one of a first plurality of select signals and an output coupled to a corresponding one of the first plurality of word-lines;
a first level shifter comprising an input to receive a clock signal and a first terminal coupled to each of the plurality of driver modules, the first level shifter configured to shift an asserted select signal of the first plurality of select signals in response to assertion of the clock signal to provide a level shifted signal at one of the first plurality of word-lines corresponding to the asserted select signal.

10. The device of claim 9, wherein the first level shifter comprises a first transistor including a first current electrode coupled to a first voltage reference, a second current electrode coupled to the first terminal, and a control electrode configured to receive the clock signal.

11. The device of claim 10, wherein each of the plurality of driver modules comprises:
a second transistor comprising a first current electrode coupled to the first terminal of the first level shifter, a second current electrode coupled to the first word-line, and a control electrode configured to receive the first clock signal; and
a third transistor comprising a first current electrode coupled to the second current electrode of the second transistor, a second current electrode, and a control electrode configured to receive the first select signal.

12. The device of claim 11, further comprising:
a fourth transistor comprising a first current electrode coupled to the second current electrode of the third transistor of each of the plurality of driver modules, a second current electrode coupled to a second voltage reference, and a control electrode configured to receive the clock signal.

13. The device of claim 12, wherein each of the plurality of driver modules further comprises:
a fifth transistor coupled between the third transistor and the fourth transistor, the fifth transistor comprising a first current electrode coupled to the second current electrode of the third transistor, a second current electrode coupled to the first current electrode of the fourth transistor, and a control electrode configured to receive a third select signal.

14. The device of claim 9, further comprising:
a second plurality of bit cells, each of the second plurality of bit cells coupled to a corresponding one of a second plurality of word-lines;
a second plurality of driver modules, each of the second plurality of driver modules comprising an input to receive a corresponding one of a second plurality of select signals and an output coupled to a corresponding one of the second plurality of word-lines;
a second level shifter comprising a first terminal coupled to each of the plurality of driver modules, the first level shifter configured to shift an asserted select signal of the second plurality of select signals to provide a level shifted signal at one of the second plurality of word-lines corresponding to the asserted select signal.

15. The device of claim 9, wherein the first plurality of word-lines comprises 8 word-lines.

16. The device of claim 9, wherein the first plurality of word-lines comprises 16 word-lines.

17. A method, comprising:
receiving a plurality of select signals comprising a first select signal and a second select signal;
in response to a clock signal being in a first state:
precharging a first node to a first voltage level associated with a first voltage reference; and
coupling a plurality of driver modules to the first node, each of the plurality of driver modules configured to drive a corresponding word-line; and
in response to the first select signal being asserted, coupling a first driver module of the plurality of driver modules to a second voltage reference to provide a level-shifted first select signal.

18. The method of claim 17, wherein receiving the plurality of select signals comprises receiving the plurality of select signals from a decode module coupled to the second voltage reference.

* * * * *